(12) United States Patent
Lin et al.

(10) Patent No.: US 11,009,783 B2
(45) Date of Patent: May 18, 2021

(54) LIQUID COOLED HEAT DISSIPATION MODULE AND PROJECTION DEVICE

(71) Applicant: Coretronic Corporation, Hsin-Chu (TW)

(72) Inventors: Tsung-Ching Lin, Hsin-Chu (TW); Wei-Chi Liu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/516,252

(22) Filed: Jul. 18, 2019

(65) Prior Publication Data

US 2020/0026168 A1    Jan. 23, 2020

(30) Foreign Application Priority Data

Jul. 23, 2018   (CN) .......................... 201821163602.9

(51) Int. Cl.
*G03B 21/16* (2006.01)
*H05K 7/20* (2006.01)

(52) U.S. Cl.
CPC ......... *G03B 21/16* (2013.01); *H05K 7/20272* (2013.01); *H05K 7/20327* (2013.01)

(58) Field of Classification Search
CPC ............... G03B 21/16; H05K 7/20327; H05K 7/20272; H01L 23/473; H01L 2924/0002; H01L 33/648; H01L 25/0753; G02F 1/133603; G02F 2001/133628; F21V 29/56; F21V 29/51; F21Y 2115/10
See application file for complete search history.

(56) References Cited

U.S. PATENT DOCUMENTS

| 8,718,109 B2 | 5/2014 | Saruwatari et al. |
| 2005/0157269 A1* | 7/2005 | Seto ...................... H04N 9/3105 353/61 |
| 2019/0207357 A1* | 7/2019 | Cheng ........................ F21V 5/04 |

FOREIGN PATENT DOCUMENTS

| TW | I504028 | 10/2015 |
| TW | I612266 | 1/2018 |

* cited by examiner

*Primary Examiner* — Michelle M Iacoletti
*Assistant Examiner* — Danell L Owens
(74) *Attorney, Agent, or Firm* — JCIPRNET

(57) ABSTRACT

A liquid cooled heat dissipation module includes a housing and at least one flow channel. The housing includes a chamber, and the at least one flow channel is located in the chamber. The housing includes an upper plate, a lower plate, and a plurality of annular wall portions. Two ends of each of the annular wall portions are respectively connected to the upper plate and the lower plate. The annular wall portions respectively form a plurality of through-holes between the upper plate and the lower plate, and the through-holes penetrate through the upper plate and the lower plate. The at least one flow channel is located between two adjacent annular wall portions. In addition, a projection device is also provided.

20 Claims, 5 Drawing Sheets

LIQUID COOLED HEAT DISSIPATION MODULE AND PROJECTION DEVICE

CROSS-REFERENCE TO RELATED APPLICATION

This application claims the priority benefit of China application serial no. 201821163602.9, filed on Jul. 23, 2018. The entirety of the above-mentioned patent application is hereby incorporated by reference herein and made a part of this specification.

BACKGROUND OF THE INVENTION

Field of the Invention

The disclosure relates to a heat dissipation module and an optical device, and in particular, to a liquid cooled heat dissipation module and a projection device.

Description of Related Art

Conventional projectors mostly use high-pressure mercury lamps as the light source. In recent years, with the advance in semiconductor manufacturing techniques, projection devices using solid-state light sources such as light-emitting diodes (LED) and laser diodes (LD) as light sources have become available. Generally, the solid-state semiconductor as the light source exhibits advantages of a small size and a high brightness. However, the solid-state semiconductor as the light source also exhibits characteristics of a higher heat generation density at the same time and thus has higher requirements for the heat dissipation technique.

In a present projection device, the combined structure of the light source and the heat dissipation module has the following form. A laser component as the light source is assembled with a base, heat pipes of the heat dissipation module are welded on a flat plate, and the flat plate of the heat dissipation module and the base are pressed together by using thermal conductivity materials. Therefore, the heat of the laser need to pass through multiple layers of thermal conduction paths including the base, the flat plate, and the heat pipes to be conducted from the heat pipes to the fins for dissipation. On the other hand, to accommodate the circuit connection and structure requirements of the laser component, the base and the flat plate both have certain thicknesses and rely on the thermal conductivity capability of the materials to dissipate heat. Therefore, a certain temperature difference must be present between the laser component and the heat pipes. Moreover, the thermal conductivity materials between the flat plate of the heat dissipation module and the base also lead to thermal contact resistance and cause a temperature difference. These temperature differences are not favorable to heat dissipation. Therefore, such a combined structure having multiple layers of thermal conductivity paths reduces the heat dissipation capability.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY OF THE INVENTION

The invention provides a liquid cooled heat dissipation module that exhibits excellent heat dissipation capability.

The invention provides a projection device that exhibits excellent reliability.

Other purposes and advantages of the embodiments of the invention may be further understood according to the technical features disclosed herein.

To achieve one, part, or all of the foregoing purposes or other purposes, an embodiment of the invention provides a liquid cooled heat dissipation module. The liquid cooled heat dissipation module includes a housing and at least one flow channel. The housing has a chamber, and the housing includes an upper plate, a lower plate, and a plurality of annular wall portions. Two ends of each of the annular wall portions are respectively connected to the upper plate and the lower plate. The annular wall portions respectively form a plurality of through-holes between the upper plate and the lower plate, and the through-holes penetrate through the upper plate and the lower plate. The at least one flow channel is located in the chamber, and the at least one flow channel is located between two adjacent of the annular wall portions.

To achieve one, part, or all of the foregoing purposes or other purposes, an embodiment of the invention provides a projection device. The projection device includes the aforementioned liquid cooled heat dissipation module and a plurality of light-emitting elements. The light-emitting elements are respectively disposed to penetrate through a plurality of through-holes.

Based on the above, the embodiments of the invention at least have one of the advantages or effects below. In the embodiments of the invention, through the configuration of the at least one flow channel located in the chamber of the housing, the fluid for cooling can pass through the liquid cooled heat dissipation module. Further, by carrying away the heat generated by the light-emitting elements through the cooling fluid, thermal resistance of the materials and thermal contact resistance can be reduced as much as possible to further reduce the temperature difference between the light-emitting elements (target) and the liquid cooled heat dissipation module after thermal conducting. Meanwhile, since the liquid cooled heat dissipation module dissipates heat through the fluid therein, the liquid cooled heat dissipation module has a higher heat transfer coefficient and exhibits excellent heat dissipation capability. On the other hand, in the embodiments of the invention, the projection device can exhibit excellent reliability by using the liquid cooled heat dissipation module having excellent heat dissipation capability.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
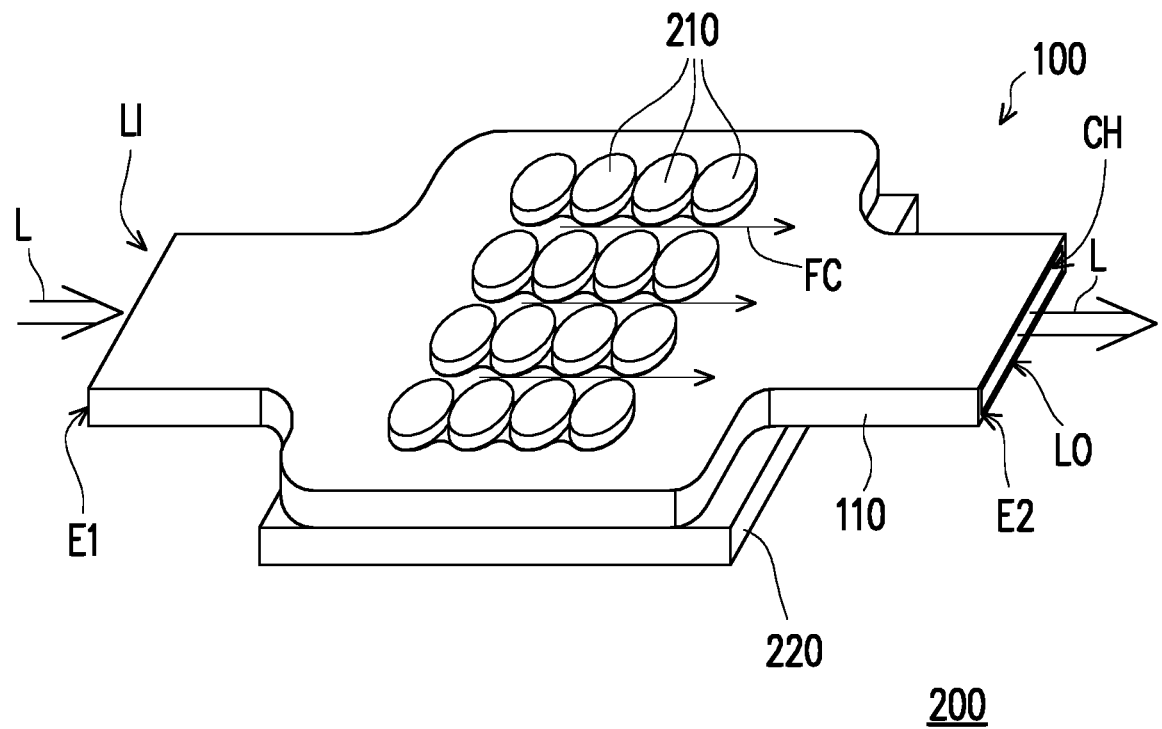
FIG. 1A is a framework schematic diagram illustrating a projection device according to an embodiment of the invention.
Figure 1B:
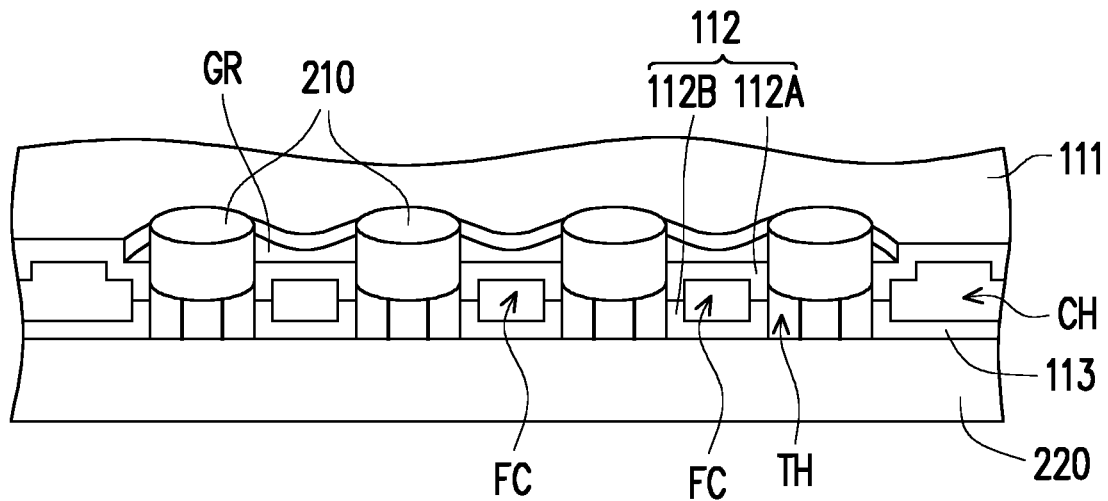
FIG. 1B is a cross-sectional view of the projection device of FIG. 1A.

FIG. 1A is a framework schematic diagram illustrating a projection device according to an embodiment of the invention. FIG. 1B is a cross-sectional view of the projection device of FIG. 1A. Referring to FIG. 1A and FIG. 1B, a projection device 200 of the embodiment includes a liquid cooled heat dissipation module 100, a plurality of light-emitting elements 210, and a circuit board 220. As shown in FIG. 1A and FIG. 1B, in the embodiment, the circuit board 220 is disposed on one side of the liquid cooled heat dissipation module 100 (for example, located under the liquid cooled heat dissipation module 100 as shown in the drawings). Moreover, as shown in FIG. 1B, in the embodiment, the light-emitting elements 210 are respectively disposed to penetrate through a plurality of through-holes TH of the liquid cooled heat dissipation module 100 from the other side of the liquid cooled heat dissipation module 100, and the circuit board 220 is electrically connected to the light-emitting elements 210. In other words, the pins or wirings (unlabeled) of the light-emitting elements 210 are electrically connected to the circuit board 220 via the corresponding through-holes TH. For example, in the embodiment, the light-emitting elements 210 may be solid-state light sources such as light-emitting diodes (LED) and laser diodes, but the invention is not limited thereto. The structure of the liquid cooled heat dissipation module 100 will be further described below with reference to FIG. 2A to FIG. 2C.

Figure 2A:
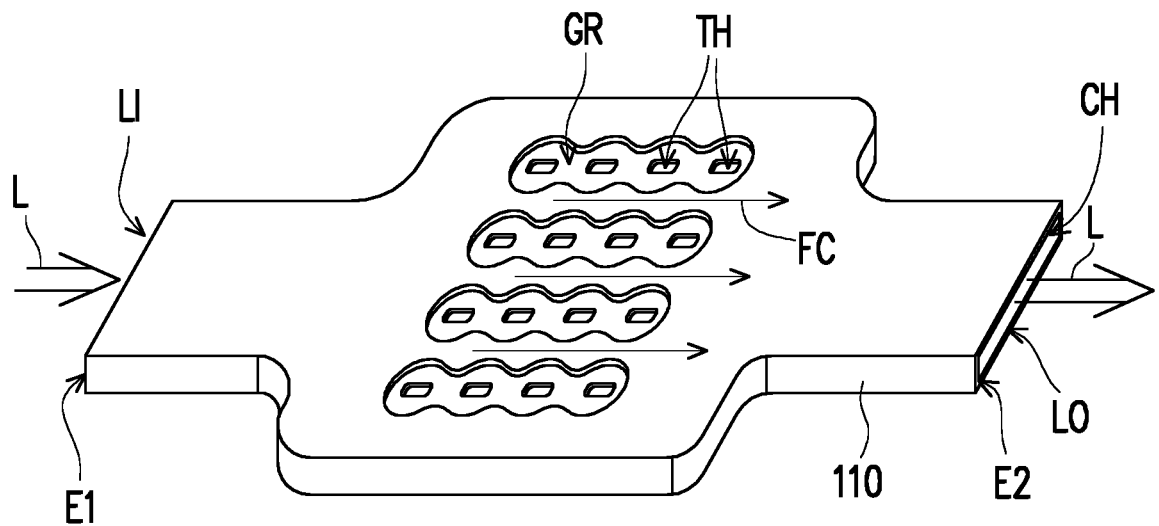
FIG. 2A is a structural schematic diagram illustrating a liquid cooled heat dissipation module of FIG. 1A.
Figure 2B:
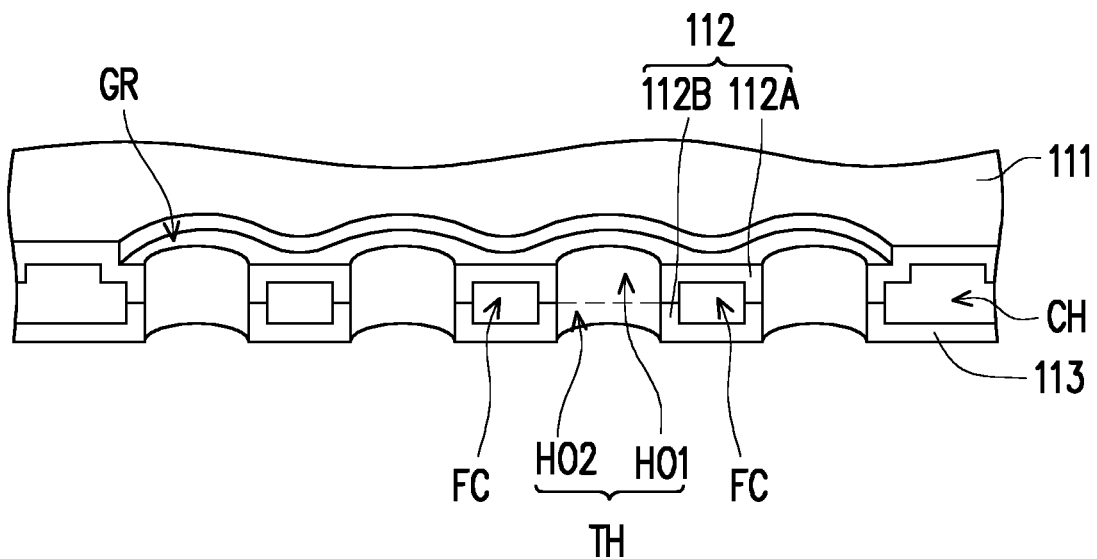
FIG. 2B is a structural schematic diagram illustrating the liquid cooled heat dissipation module of FIG. 1A.
Figure 2C:
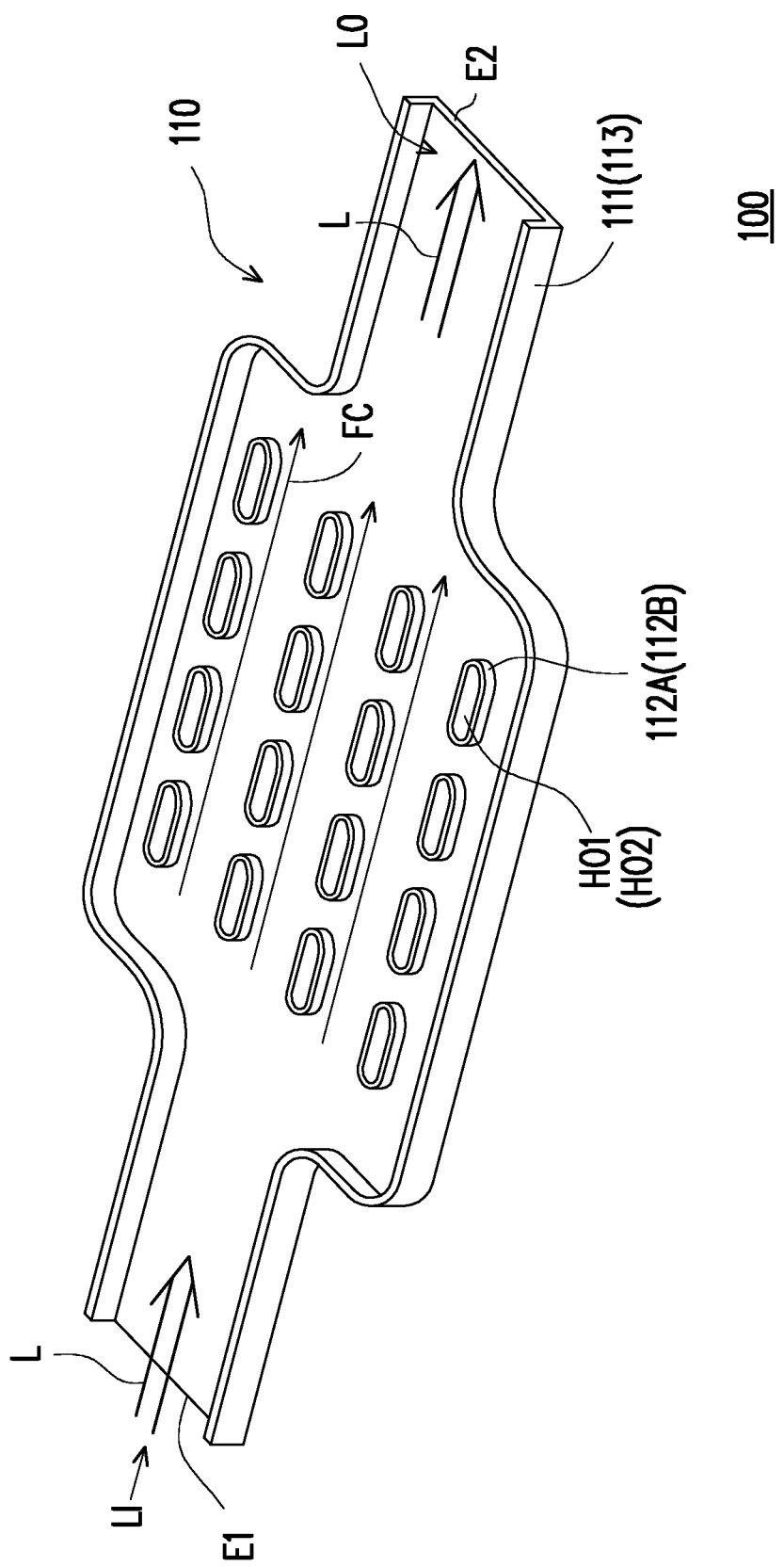
FIG. 2C is an internal structural schematic diagram illustrating an upper plate or a lower plate of the liquid cooled heat dissipation module of FIG. 1A.

FIG. 2A is a structural schematic diagram illustrating the liquid cooled heat dissipation module of FIG. 1A. FIG. 2B is a structural schematic diagram illustrating the liquid cooled heat dissipation module of FIG. 1A. FIG. 2C is an internal structural schematic diagram illustrating an upper plate or a lower plate of the liquid cooled heat dissipation module of FIG. 1A. As shown in FIG. 2A to FIG. 2C, in the embodiment, the liquid cooled heat dissipation module 100 includes a housing 110 and at least one flow channel FC. The housing 110 has a chamber CH, and the housing 110 includes an upper plate 111, a lower plate 113, and a plurality of annular wall portions 112. The upper plate 111 and the lower plate 113 may be combined correspondingly to form the chamber CH located between the upper plate 111 and the lower plate 113. The annular wall portions 112 are located in the chamber CH. For example, in the embodiment, the upper plate 111, the lower plate 113, or the annular wall portions 112 of the housing 110 include high thermal conductivity materials and thus exhibit excellent thermal conductivity. For example, the high thermal conductivity materials may be metals or silicon.

Specifically, as shown in FIG. 2A to FIG. 2C, in the embodiment, two ends of each of the annular wall portions 112 are respectively connected to the upper plate 111 and the lower plate 113. The annular wall portions 112 respectively form a plurality of through-holes TH between the upper plate 111 and the lower plate 113, and the through-holes TH penetrate through the upper plate 111 and the lower plate 113. The at least one flow channel FC is located in the chamber CH, and the at least one flow channel FC is located between two adjacent annular wall portions 112.

More specifically, as shown in FIG. 2B to FIG. 2C, in the embodiment, the housing 110 further includes a plurality of first annular protrusion portions 112A and a plurality of second annular protrusion portions 112B. The first annular protrusion portions 112A are disposed on the upper plate 111. The second annular protrusion portions 112B are disposed on the lower plate 113. On the other hand, one end of each of the through-holes TH forms a first hole HO1 on the upper plate 111, and the other end of each of the through-holes TH forms a second hole HO2 on the lower plate 113. As shown in FIG. 2B, in the embodiment, the first annular protrusion portions 112A protrude from the periphery of the corresponding first holes HO1 towards the lower plate 113, and the second annular protrusion portions 112B protrude from the periphery of the corresponding second holes HO2 towards the upper plate 111.

Therefore, as shown in FIG. 2B, in the embodiment, since the second annular protrusion portions 112B and the first annular protrusion portions 112A correspond to each other and the first holes HO1 and the second holes HO2 correspond to each other, after the upper plate 111 and the lower plate 113 are combined to bond the first annular protrusion portions 112A with the second annular protrusion portions 112B, the first annular protrusion portions 112A and the second annular protrusion portions 112B can form the annular wall portions 112. For example, in the embodiment, the first annular protrusion portions 112A and the second annular protrusion portions 112B may be bonded together by interference fit, welding, adhesion, or solid-state diffusion (diffusion welding technique).

Accordingly, the liquid cooled heat dissipation module 100 as shown in FIG. 1A or FIG. 2A can be formed. Specifically, as shown in FIG. 1A and FIG. 2A, in the embodiment, the liquid cooled heat dissipation module 100 includes a liquid inlet LI and a liquid outlet LO. The liquid inlet LI is located on a first end E1 of the housing 110 to inject a cooling fluid L into the chamber CH. The liquid outlet LO is located on a second end E2 of the housing 110, and the second end E2 of the housing 110 is configured opposite to the first end E1 of the housing 110. Accordingly, as shown in FIG. 1A, after the cooling fluid L is injected into the chamber CH via the liquid inlet LI, the cooling fluid L flows through the at least one flow channel FC and is discharged out of the chamber CH via the liquid outlet LO. For example, in the embodiment, the cooling fluid L may be a single-phase liquid or a two-phase fluid. Specifically, the two-phase fluid is, for example, a refrigerant. When the cooling fluid L is a refrigerant, in the process where the injected cooling fluid L flows through the at least one flow channel FC, the cooling fluid L carries heat away through a transition from the gas phase to the liquid phase. Compared to the air, the single-phase liquid and the two-phase fluid both have a higher heat convection coefficient, so they can enable the liquid cooled heat dissipation module 100 to exhibit excellent heat dissipation capability.

Accordingly, as shown in FIG. 1A and FIG. 1B, since the annular wall portions 112 surround the light-emitting elements 210, and the at least one flow channel FC is located between two adjacent light-emitting elements 210 (i.e., between two adjacent annular wall portions 112), when the cooling fluid L flows through the at least one flow channel FC, the heat generated by the light-emitting elements 210 can be rapidly carried away by the cooling fluid L to keep the temperature of the projection device 200 stable. Moreover, as shown in FIG. 2A, in the embodiment, the upper plate 111 of the housing 110 may be optionally formed with a groove structure GR. The groove structure GR is disposed, for example, on the outer surface of the upper plate 111 opposite to the chamber CH and is concave inwards. The light-emitting elements 210 may be supported on the groove structure GR, and the groove structure GR may be used to increase the area of the annular wall portions 112 surrounding the light-emitting elements 210. Therefore, the volume of the fluid that can carry away the heat of the light-emitting elements 210 can meanwhile be increased to achieve even better heat dissipation effect and reliability.

In this way, through the configuration of the at least one flow channel FC located in the chamber CH of the housing 110, the fluid for cooling can pass through the liquid cooled heat dissipation module 100. Further, by carrying away the heat generated by the light-emitting elements 210 through the cooling fluid L, thermal resistance of the materials and thermal contact resistance between the materials can be reduced as much as possible to further reduce the temperature difference between the light-emitting elements (target) and the liquid cooled heat dissipation module after thermal conducting. Meanwhile, since the liquid cooled heat dissipation module 100 dissipates heat through the fluid flowing inside the chamber CH, the liquid cooled heat dissipation module 100 has a higher heat transfer coefficient and exhibits excellent heat dissipation capability. On the other hand, the projection device 200 can exhibit excellent reliability by using the liquid cooled heat dissipation module 100 having excellent heat dissipation capability.

Figure 3:
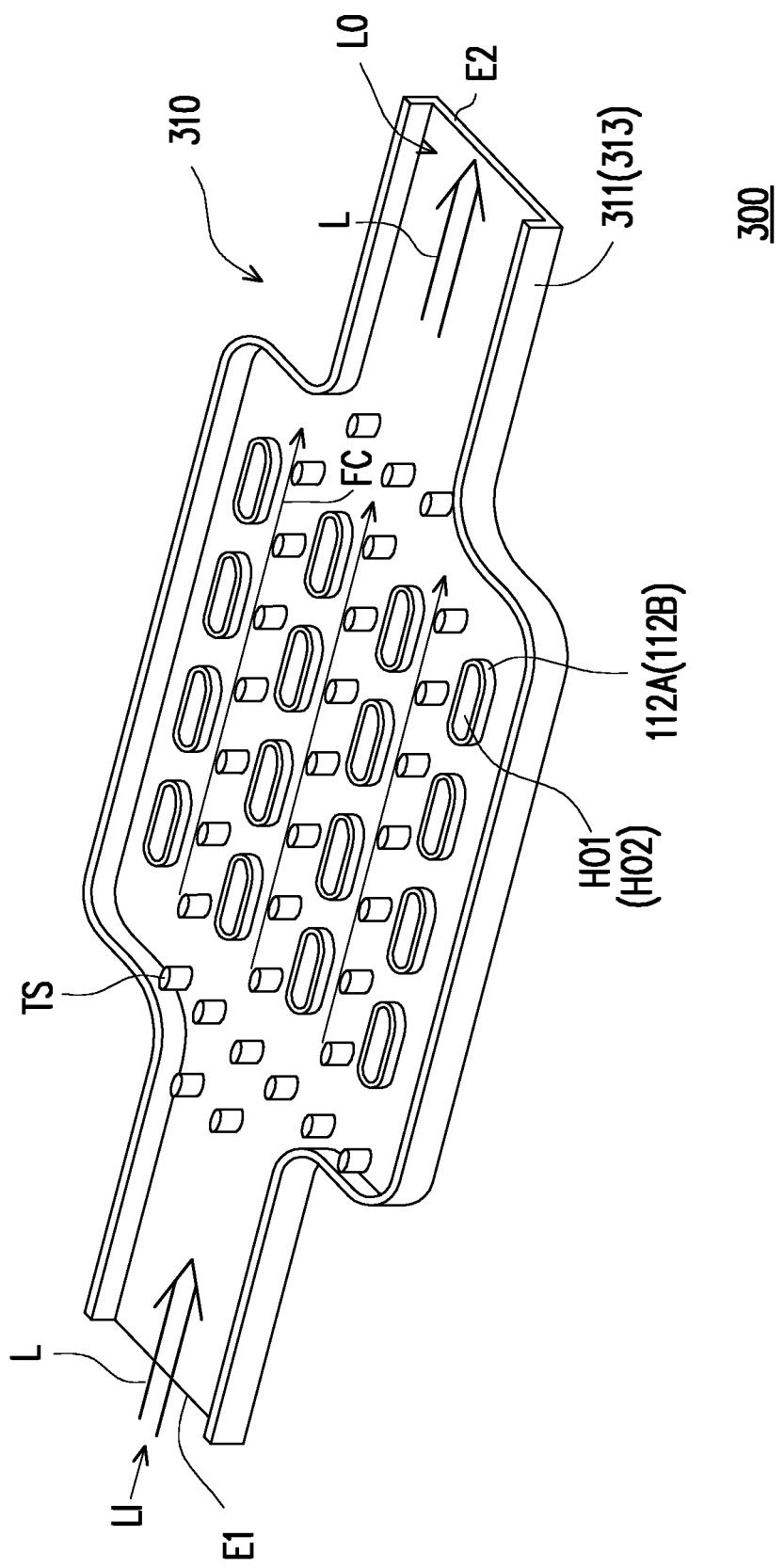
FIG. 3 is an internal structural schematic diagram illustrating another liquid cooled heat dissipation module according to an embodiment of the invention.

FIG. 3 is an internal structural schematic diagram illustrating another liquid cooled heat dissipation module according to an embodiment of the invention. A liquid cooled heat dissipation module 300 of FIG. 3 is similar to the liquid cooled heat dissipation module 100 of FIG. 2A to FIG. 2C, and the difference is as described below. As shown in FIG. 3, in the embodiment, the liquid cooled heat dissipation module 300 further includes a plurality of heat dissipation structures TS. The heat dissipation structures TS are disposed at an interval between an upper plate 311 and a lower plate 313 and are located on at least one flow channel FC. For example, the heat dissipation structures TS include high thermal conductivity materials and thus exhibit excellent thermal conductivity. For example, the high thermal conductivity materials may be metals and may be formed into a plurality of protrusions or fin structures on the upper plate 311 or/and the lower plate 313 of the housing 310 by stamping or etching. Accordingly, since the heat dissipation structures TS are further disposed on the at least one flow channel FC, the heat dissipation capability of the liquid cooled heat dissipation module 300 can be enhanced.

In the embodiment, since the liquid cooled heat dissipation module 300 has a structure similar to that of the liquid cooled heat dissipation module 100 of FIG. 2A to FIG. 2C, the liquid cooled heat dissipation module 300 can achieve similar function through the configuration of the at least one flow channel FC located in the chamber of the housing 310. Therefore, the liquid cooled heat dissipation module 300 can achieve effects and advantages similar to those of the liquid cooled heat dissipation module 100, which shall not be repeatedly described here. Moreover, when the liquid cooled heat dissipation module 300 is applied to the projection device 200 above, it also enables the projection device 200 to achieve similar effects and advantages, which shall not be repeatedly described here, either.

Figure 4:
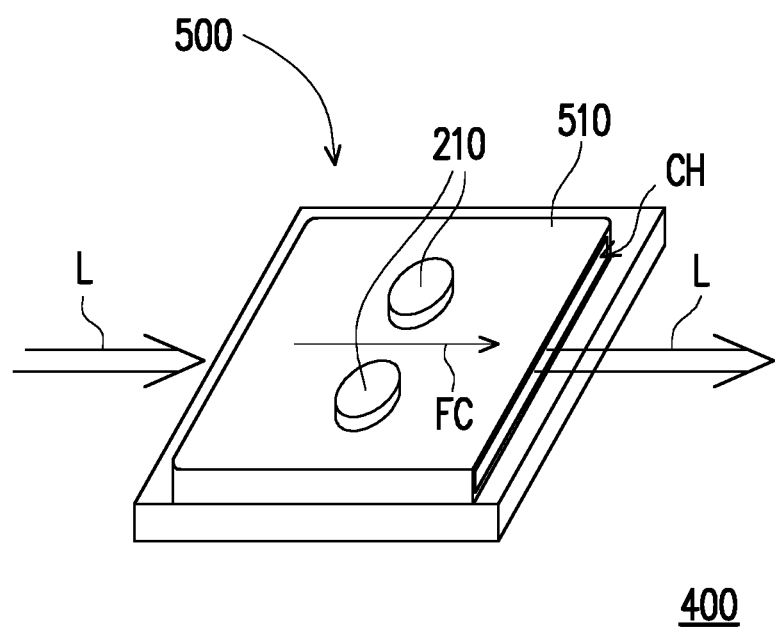
FIG. 4 is a framework schematic diagram illustrating another projection device according to an embodiment of the invention.

FIG. 4 is a framework schematic diagram illustrating another projection device according to an embodiment of the invention. A projection device 400 of FIG. 4 is similar to the projection device 200 of FIG. 1A. The difference is as described below. As shown in FIG. 4, in the embodiment, a housing 510 of a liquid cooled heat dissipation module 500 is integrally formed to one piece, and the numbers of the light-emitting elements 210 and the through-holes (not shown) may be adequately adjusted according to the requirements in the manufacturing process. However, the at least one flow channel FC of the liquid cooled heat dissipation module 500 is still located between two adjacent light-emitting elements 210, and heat dissipation is performed for the light-emitting elements 210 through the cooling fluid L flowing inside the chamber CH.

Accordingly, in the embodiment, through the configuration of the at least one flow channel FC located in the chamber CH of the housing 510, the liquid cooled heat dissipation module 500 can still achieve function similar to that of the liquid cooled heat dissipation module 100 of FIG. 2A to FIG. 2C and can achieve effects and advantages similar to those of the liquid cooled heat dissipation module 100, which shall not be repeatedly described here. Moreover, by using the liquid cooled heat dissipation module 500, the projection device 400 can also achieve effects and advantages similar to those of the projection device 200 above, which shall not be repeatedly described here, either.

In summary of the above, the embodiments of the invention at least exhibit one of the advantages or effects below. In the embodiments of the invention, through the configuration of the at least one flow channel located in the chamber of the housing, the fluid for cooling can pass through the liquid cooled heat dissipation module. Further, by carrying away the heat generated by the light-emitting elements through the cooling fluid, thermal resistance of the materials and thermal contact resistance between the materials can be reduced as much as possible to further reduce the temperature difference between the light-emitting elements (target) and the liquid cooled heat dissipation module after thermal conducting. Meanwhile, since the liquid cooled heat dissipation module dissipates heat through the fluid therein, the liquid cooled heat dissipation module has a higher heat transfer coefficient and exhibits excellent heat dissipation capability. On the other hand, in the embodiments of the invention, the projection device can exhibit excellent reliability by using the liquid cooled heat dissipation module having excellent heat dissipation capability.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A liquid cooled heat dissipation module comprising:
a housing, having a chamber, and the housing comprising an upper plate, a lower plate, and a plurality of annular wall portions, wherein two ends of each of the annular wall portions are respectively connected to the upper plate and the lower plate, the annular wall portions respectively form a plurality of through-holes between the upper plate and the lower plate, and the through-holes penetrate through the upper plate and the lower plate; and
at least one flow channel, located in the chamber, wherein the at least one flow channel is located between two adjacent of the annular wall portions,
wherein the housing further comprises:
a plurality of first annular protrusion portions, disposed on the upper plate; and
a plurality of second annular protrusion portions, disposed on the lower plate, wherein the second annular protrusion portions correspond to the first annular protrusion portions, and the first annular protrusion portions and the second annular protrusion portions form the annular wall portions.

2. The liquid cooled heat dissipation module according to claim 1, wherein one end of each of the through-holes forms a first hole on the upper plate, another end of each of the through-holes forms a second hole on the lower plate, and the first holes and the second holes correspond to each other.

3. The liquid cooled heat dissipation module according to claim 2, wherein the first annular protrusion portions protrude from a periphery of the corresponding first holes towards the lower plate, and the second annular protrusion portions protrude from a periphery of the corresponding second holes towards the upper plate, such that the first annular protrusion portions and the second annular protrusion portions form the annular wall portions.

4. The liquid cooled heat dissipation module according to claim 1, wherein the first annular protrusion portions and the second annular protrusion portions are bonded together by interference fit, welding, adhesion, or solid-state diffusion.

5. The liquid cooled heat dissipation module according to claim 1, wherein the upper plate, the lower plate, or the annular wall portions comprise high thermal conductivity materials.

6. The liquid cooled heat dissipation module according to claim 1, further comprising:
a plurality of heat dissipation structures, disposed between the upper plate and the lower plate and located on the at least one flow channel.

7. The liquid cooled heat dissipation module according to claim 1, further comprising:
a liquid inlet, located on a first end of the housing to inject a cooling fluid into the chamber; and
a liquid outlet, located on a second end of the housing, wherein after the cooling fluid is injected via the liquid inlet, the cooling fluid flows through the at least one flow channel and is discharged out of the chamber via the liquid outlet.

8. The liquid cooled heat dissipation module according to claim 1, wherein the housing is integrally formed to one piece.

9. The liquid cooled heat dissipation module according to claim 7, wherein the cooling fluid is a single-phase liquid or a two-phase fluid.

10. A projection device comprising:
a liquid cooled heat dissipation module, comprising:
  a housing, having a chamber, and the housing comprising an upper plate, a lower plate, and a plurality of annular wall portions, wherein two ends of each of the annular wall portions are respectively connected to the upper plate and the lower plate, the annular wall portions respectively form a plurality of through-holes between the upper plate and the lower plate, and the through-holes penetrate through the upper plate and the lower plate; and
  at least one flow channel, located in the chamber, wherein the at least one flow channel is located between two adjacent of the annular wall portions, wherein the housing further comprises:
    a plurality of first annular protrusion portions, disposed on the upper plate; and
    a plurality of second annular protrusion portions, disposed on the lower plate, wherein the second annular protrusion portions correspond to the first annular protrusion portions, and the first annular protrusion portions and the second annular protrusion portions form the annular wall portions; and
  a plurality of light-emitting elements, respectively disposed to penetrate through the through-holes.

11. The projection device according to claim 10, wherein the annular wall portions surround the light-emitting elements, and the at least one flow channel is located between two adjacent of the light-emitting elements.

12. The projection device according to claim 10, further comprising:
  a circuit board disposed, under the liquid cooled heat dissipation module, wherein the circuit board is electrically connected to the light-emitting elements.

13. The projection device according to claim 10, wherein one end of each of the through-holes forms a first hole on the upper plate, another end of each of the through-holes forms a second hole on the lower plate, and the first holes and the second holes correspond to each other.

14. The projection device according to claim 13, wherein the first annular protrusion portions protrude from a periphery of the corresponding first holes towards the lower plate, and the second annular protrusion portions protrude from a periphery of the corresponding second holes towards the upper plate, such that the first annular protrusion portions and the second annular protrusion portions form the annular wall portions.

15. The projection device according to claim 10, wherein the first annular protrusion portions and the second annular protrusion portions are bonded together by interference fit, welding, adhesion, or solid-state diffusion.

16. The projection device according to claim 10, wherein the upper plate, the lower plate, or the annular wall portions comprise high thermal conductivity materials.

17. The projection device according to claim 10, wherein the liquid cooled heat dissipation module further comprises:
  a plurality of heat dissipation structures, disposed between the upper plate and the lower plate and located on the at least one flow channel.

18. The projection device according to claim 10, wherein the liquid cooled heat dissipation module further comprises:
  a liquid inlet, located on a first end of the housing to inject a cooling fluid into the chamber; and
  a liquid outlet, located on a second end of the housing, wherein after the cooling fluid is injected via the liquid inlet, the cooling fluid flows through the at least one flow channel and is discharged out of the chamber via the liquid outlet.

19. The projection device according to claim 18, wherein the cooling fluid is a single-phase liquid or a two-phase fluid.

20. The projection device according to claim 10, wherein the housing is integrally formed.

* * * * *